United States Patent
Naito et al.

(10) Patent No.: US 11,955,394 B2
(45) Date of Patent: Apr. 9, 2024

(54) HOLLOW PACKAGE AND METHOD FOR MANUFACTURING SAME

(71) Applicants: Sumitomo Bakelite Co., Ltd., Tokyo (JP); Nippon Kayaku Kabushiki Kaisha, Tokyo (JP); Towa Corporation, Kyoto (JP)

(72) Inventors: Tadashi Naito, Tokyo (JP); Nao Honda, Tokyo (JP); Yoshihiro Hakone, Tokyo (JP); Hiroki Oshida, Kyoto (JP); Mamoru Sunada, Kyoto (JP)

(73) Assignee: Nippon Kayaku Kabushiki Kaisha, Tokyo (JP)

(*) Notice: Subject to any disclaimer, the term of this patent is extended or adjusted under 35 U.S.C. 154(b) by 422 days.

(21) Appl. No.: 17/413,728

(22) PCT Filed: Dec. 13, 2019

(86) PCT No.: PCT/JP2019/048907
§ 371 (c)(1),
(2) Date: Jun. 14, 2021

(87) PCT Pub. No.: WO2020/137610
PCT Pub. Date: Jul. 2, 2020

(65) Prior Publication Data
US 2022/0068737 A1 Mar. 3, 2022

(30) Foreign Application Priority Data
Dec. 27, 2018 (JP) .................. 2018-246180

(51) Int. Cl.
*H01L 23/29* (2006.01)
*B81B 7/00* (2006.01)
(Continued)

(52) U.S. Cl.
CPC .......... *H01L 23/295* (2013.01); *B81B 7/0077* (2013.01); *B81C 1/00333* (2013.01);
(Continued)

(58) Field of Classification Search
CPC ..... H01L 23/295; H01L 21/56; H01L 23/053; H01L 23/3121; H01L 2224/16225;
(Continued)

(56) References Cited

U.S. PATENT DOCUMENTS

2013/0108961 A1   5/2013   Oonishi et al.
2014/0099581 A1   4/2014   Nagaki et al.
(Continued)

FOREIGN PATENT DOCUMENTS

JP    2012-209817 A    10/2012
JP    2012209817    * 10/2012
(Continued)

OTHER PUBLICATIONS

Takeshi et al. (JP 2012-209817) machine translation (Year: 2012).*
(Continued)

*Primary Examiner* — Yasser A Abdelaziez
(74) *Attorney, Agent, or Firm* — NIELDS, LEMACK & FRAME, LLC

(57) ABSTRACT

A hollow package (103) includes a substrate (109), an element (111), a partition wall (113), and a top plate (115) and has one or more closed hollow parts (117) that are covered by the substrate (109), the partition wall (113), and the top plate (115), and the substrate (109), the partition wall (113), and the top plate (115) are sealed with a cured product of a sealing resin composition. The top plate (115) and the partition wall (113) are composed of an organic material, and the thickness of the top plate (115), the thickness of the partition wall (113), the width of the partition wall, and the maximum width of the hollow part (117) are each within
(Continued)

respective predetermined ranges. The sealing resin composition comprises (A) an epoxy resin that includes one or more selected from the group consisting of an epoxy resin containing two epoxy groups in the molecule and an epoxy resin containing three or more epoxy resins in the molecule and (B) an inorganic filler.

15 Claims, 4 Drawing Sheets

(51) Int. Cl.
*B81C 1/00* (2006.01)
*G03F 7/038* (2006.01)
*H01L 21/56* (2006.01)

(52) U.S. Cl.
CPC ............ *G03F 7/0385* (2013.01); *H01L 21/56* (2013.01); *B81C 2203/0154* (2013.01)

(58) Field of Classification Search
CPC ... H01L 23/08; H01L 2924/181; H01L 23/29; B81B 7/0077; B81B 2201/0271; B81B 2207/012; B81B 7/0058; B81C 1/00333; B81C 2203/0154; B81C 2203/0163; G03F 7/0385; G03F 7/038; G03F 7/004; G03F 7/26

See application file for complete search history.

(56) References Cited

U.S. PATENT DOCUMENTS

| 2017/0047232 | A1 | 2/2017 | Glascock et al. |
| 2017/0288627 | A1* | 10/2017 | Takano ............... H03H 3/0072 |
| 2021/0028077 | A1* | 1/2021 | Bellman ............... H01L 33/483 |
| 2023/0006127 | A1* | 1/2023 | Menture ............... H10N 30/09 |

FOREIGN PATENT DOCUMENTS

| JP | WO2016/092964 | * | 6/2016 |
| JP | 2017-171873 A | | 9/2017 |
| WO | 2012/008472 A1 | | 1/2012 |
| WO | 2012/176750 A1 | | 12/2012 |

OTHER PUBLICATIONS

Ishii et al. (WO 2016/092964) machine translation (Year: 2016).*
International Search Report and Written Opinion dated Mar. 3, 2020 in corresponding PCT application No. PCT/JP2019/048907.

* cited by examiner (a)

(b)

(c)

(d)

(e)

HOLLOW PACKAGE AND METHOD FOR MANUFACTURING SAME

TECHNICAL FIELD

The present invention relates to a hollow package and a manufacturing method thereof.

BACKGROUND ART

A technique related to sealing of a semiconductor package is described in Patent Literature 1 (US-A-2017/0047232). Patent Literature 1 describes that a surface mounted element such as a bulk acoustic wave (BAW) filter element is mounted on an upper surface of a substrate, and the surface mounted element is covered and sealed with a sheet sealing resin composition.

CITATION LIST

Patent Literature

PATENT LITERATURE 1: US-A-2017/0047232

SUMMARY OF INVENTION

Technical Problem

Under the recent package development environment, there has been an increasing demand for reducing thickness, size, and pitch of terminal intervals. Considering this demand, the present inventors have studied the technique described in the above literature, and it has been found that even in the case of sealing an element having a hollow part, there is room for improvement in terms of stably maintaining the hollow structure after molding and obtaining a package having excellent filling properties to a narrow gap under the chip.

Therefore, the present invention provides a sealing technique for obtaining a package excellent in molding resistance of an element provided with a hollow part and excellent in filling properties to a narrow gap.

Solution to Problem

According to the present invention, a hollow package is provided, including:
  a substrate;
  one or more elements selected from the group consisting of a semiconductor element, a micro-electronic-mechanical systems (MEMS) component, and an electronic component and mounted on the substrate;
  a partition wall provided on an upper part of the substrate and surrounding an outer periphery of the one or more elements; and
  a top plate provided in contact with an upper surface of the partition wall and covering an upper part of the one or more elements,
  in which one or more closed hollow parts that are each covered with the substrate, the partition wall, and the top plate are provided, and the substrate, the partition wall, and the top plate are sealed with a cured product of a sealing resin composition, and
  in which the top plate and the partition wall both include an organic material,
  the top plate has a thickness of 10 μm or more and 50 μm or less,
  the partition wall has a thickness of 5 μm or more and 30 μm or less and has a width of 5 μm or more and 200 μm or less,
  the one or more closed hollow parts each have a maximum width of 60 μm or more and 1000 μm or less in a cross section perpendicular to a surface of the substrate on which the one or more elements are mounted, and
  the sealing resin composition contains:
  (A) an epoxy resin containing one or more selected from the group consisting of an epoxy resin containing two epoxy groups in the molecule and an epoxy resin containing three or more epoxy groups in the molecule; and
  (B) an inorganic filler.

Further, according to the present invention, a method for manufacturing a hollow package is provided, the method including the following steps 1 and 2:
  (step 1) providing one or more closed hollow parts by forming a partition wall and a top plate that include at least one organic material on a substrate; and
  (step 2) compression-molding a sealing resin composition at a low pressure of 0.1 MPa or more and less than 5.0 MPa to resin-seal the substrate, the partition wall, and the top plate,
  in which the step 1 includes a step of mounting one or more elements selected from the group consisting of a semiconductor element, a MEMS component, and an electronic component on the substrate so that the one or more elements are disposed in the one or more closed hollow parts, and
  the sealing resin composition includes:
  (A) an epoxy resin containing one or more selected from the group consisting of an epoxy resin containing two epoxy groups in the molecule and an epoxy resin containing three or more epoxy groups in the molecule; and
  (B) an inorganic filler.

Advantageous Effects of Invention

According to the present invention, it is possible to provide a sealing technique for obtaining a package excellent in molding resistance of an element provided with a hollow part and excellent in filling properties to a narrow gap.

BRIEF DESCRIPTION OF DRAWINGS

The foregoing and other objects, features, and advantages will become more apparent from the following preferred embodiments and accompanying drawings.

DESCRIPTION OF EMBODIMENTS

Figure 1:
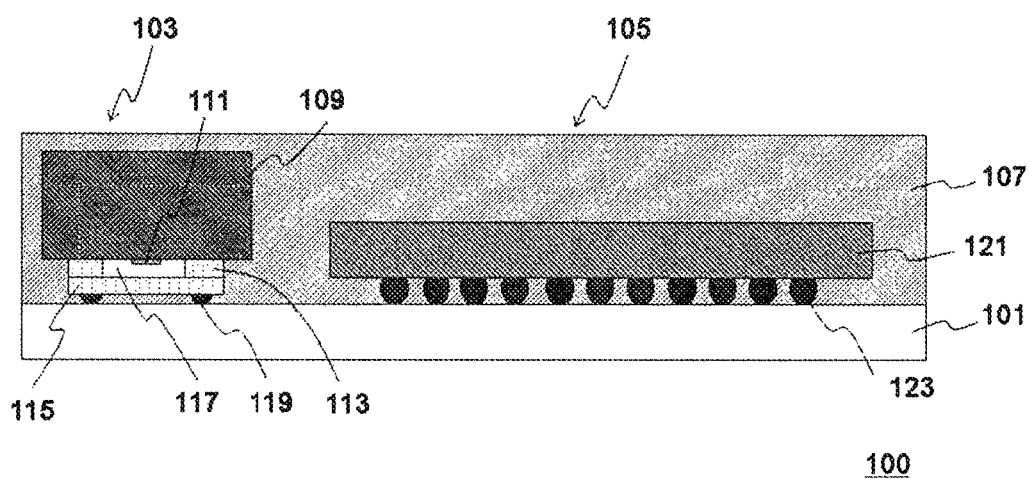
FIG. 1 is a sectional view illustrating the configuration of a structure in an embodiment according to the present invention.

Hereinafter, embodiments according to the present invention will be described with reference to the drawings. In all the drawings, the same components are denoted by the same reference numerals, and the description thereof will be omitted as appropriate. In addition, the drawings are schematic views, and do not necessarily coincide with actual dimensional ratios. Further, "X to Y" in the numerical range represents "X or more and Y or less" unless otherwise specified.

(Hollow Package and Structure)

FIG. 1 is a sectional view illustrating an example of the configuration of a structure in an embodiment according to the present invention. In a structure 100 shown in FIG. 1, a hollow package 103 and a package 105 are mounted on a substrate 101. As the substrate 101, for example, an organic substrate such as an interposer can be used.

Both the hollow package 103 and the package 105 are sealed with a sealing material 107. The sealing material 107 includes a cured product of a sealing resin composition.

Hereinafter, the hollow package 103 and the package 105 will be described.

First, the hollow package 103 will be described. The hollow package 103 includes a substrate 109, one or more elements 111 selected from the group consisting of a semiconductor element, a MEMS component, and an electronic component and mounted on the substrate 109, a partition wall 113 provided on the upper surface of the substrate 109 for surrounding the outer periphery of the element 111, and a top plate 115 provided in contact with the upper surface of the partition wall 113 and covering the upper part of the element 111. The hollow package 103 is provided with one or more closed hollow parts 117 covered with the substrate 109, the partition wall 113, and the top plate 115. The substrate 109, the partition wall 113, and the top plate 115 are sealed with the sealing material 107. The sealing material 107 is a cured product of a sealing resin composition. The components and their amounts of the sealing resin composition will be described later.

The hollow package 103 is flip-chip connected to the substrate 101 by bumps 119 provided on the upper part of the top plate 115. In addition, wiring (not illustrated) that connects the bumps 119 and a conductor on the substrate 101 may be provided over the upper and the side surface of the top plate 115, the side surface of the partition wall 113, and the upper surface of the substrate 101.

The element 111 may be at least one selected from the group consisting of a semiconductor element, a MEMS component, and an electronic component, and is specifically an element applied to a package provided with a hollow structure. Specific examples of the element 111 include high frequency filters such as a bulk acoustic wave (BAW) filter and surface acoustic wave (SAW) filter.

The material of the substrate 109 can be selected according to the type and the like of the element 111. The substrate 109 may be, for example, a semiconductor substrate such as a silicon substrate. When the element 111 is a high frequency filter, the material of the substrate 109 is preferably a piezoelectric body such as lithium tantalate (LT) or lithium niobate (LN).

The sizes of the partition wall 113 and the top plate 115 can be set depending on the size of the element 111.

The thickness of the partition wall 113 is preferably 5 μm or more, and more preferably 7 μm or more from the viewpoint of securing the hollow part 117 around the element 111. The thickness of the partition wall 113 is also preferably 30 μm or less, and more preferably 20 μm or less from the viewpoint of reducing the thickness of the hollow package 103.

The width of the partition wall 113 is preferably 5 μm or more, and more preferably 20 μm or more from the viewpoint of improving molding resistance. The width of the partition wall 113 is also preferably 200 μm or less, and more preferably 100 μm or less from the viewpoint of reducing the size of the hollow package 103.

Here, the thickness of the partition wall 113 refers to the length of the partition wall 113 in the direction perpendicular to the substrate 109, and the width of the partition wall 113 refers to the length of the partition wall 113 in the in-plane direction of the substrate 109.

The thickness of the top plate 115 is preferably 10 μm or more, and more preferably 15 μm or more from the viewpoint of improving molding resistance. The thickness of the top plate 115 is also preferably 50 μm or less, and more preferably 30 μm or less from the viewpoint of reducing the thickness of the hollow package 103.

Here, the thickness of the top plate 115 refers to the length of the top plate 115 in the direction perpendicular to the substrate 109.

The maximum width of the hollow part 117 in the cross section perpendicular to the element mounted surface of the substrate 109 is preferably 60 μm or more, and more preferably 100 μm or more from the viewpoint of securing the hollow part 117 around the element 111. The above-mentioned maximum width of the hollow part 117 is also preferably 1000 μm or less, and more preferably 800 μm or less from the viewpoint of reducing the size of the hollow package 103.

Examples of a cross-sectional shape of the hollow part 117 include a rectangular shape. In addition, examples of the planar shape of the hollow part 117 include square, rectangular, polygonal, circular, elliptical shapes, and a shape in which these shapes are combined.

Both the partition wall 113 and the top plate 115 preferably include an organic material. The materials of the partition wall 113 and the top plate 115 may be the same or different.

When at least one of the partition wall 113 and the top plate 115 includes an organic material, the organic material is preferably a photosensitive dry film resist, more preferably a negative photosensitive dry film resist, and still more preferably a negative photosensitive dry film resist containing a photoacid generator and an epoxy resin, from the viewpoint of stably forming the partition wall 113 and the top plate 115 by a simple process.

From the same viewpoint, the partition wall 113 and the top plate 115 preferably include a cured product of a photosensitive resin composition. Hereinafter, the components and their ratios of the photosensitive resin composition will be specifically described.

(Photosensitive Resin Composition)

As the photosensitive resin composition used for forming the partition wall 113 or the top plate 115, various photosensitive resin compositions containing a polyimide, a polyamide, a benzocyclobutene, a polybenzoxazole, a maleimide, an acrylate resin, phenol resin, epoxy resin, or the like as a main component can be used, but for example, the one described in WO-A-2012/008472 can be used. The photosensitive resin composition used herein preferably contains a photoacid generator and an epoxy resin.

The photoacid generator preferably contains tris(4-(4-acetylphenyl)thiophenyl)sulfonium tetrakis (pentafluorophenyl)borate, and more preferably, is tris(4-(4-acetylphenyl)thiophenyl)sulfonium tetrakis (pentafluorophenyl) borate. As the tris (4-(4-acetylphenyl)thiophenyl)sulfonium tetrakis (pentafluorophenyl)borate, for example, Irgacure (registered trademark) PAG 290 manufactured by BASF SE can be used.

The content of the photoacid generator in the photosensitive resin composition is preferably 0.1 mass % or more, and is also preferably 15 mass % or less with respect to 100 mass % of the total amount of the photoacid generator and the epoxy resin.

The epoxy equivalent of the epoxy resin is preferably 150 g/eq. or more from the viewpoint of decreasing the cure shrinkage rate of the photosensitive resin composition. The epoxy equivalent of the epoxy resin is also preferably 500 g/eq. or less from the viewpoint of suppressing decrease in the strength, chemical resistance, heat resistance, crack resistance, and the like of the cured film due to excessive decrease in the crosslinking density of the photosensitive resin composition.

Here, the epoxy equivalent is measured by a method in accordance with JIS K7236.

In addition, the softening point of the epoxy resin is preferably 40° C. or higher, and more preferably 50° C. or higher from the viewpoints of suppressing mask sticking and suppressing softening at ordinary temperature. The softening point of the epoxy resin is also preferably 120° C. or lower, and more preferably 100° C. or lower from the viewpoint of enhancing the bonding properties to the substrate 109.

Here, the softening point is measured by a method in accordance with JIS K7234.

The epoxy resin more preferably has an epoxy equivalent in the above-described range and a softening point in the above-described range. Specific examples of such an epoxy resin include EOCN-102S, EOCN-103S, EOCN-104S, EOCN-1020, EOCN-4400H, EPPN-201, EPPN-501H, EPPN-502H, XD-1000, BREN-S, NER-7604, NER-7403, NER-1302, NER-7516, NC-3000H (trade names, manufactured by Nippon Kayaku Co., Ltd.), Epikote 157570 (trade name, manufactured by Mitsubishi Chemical Corporation), and EHPE3150 (trade name, manufactured by Daicel Corporation).

Specific examples of the epoxy resin include a novolac type epoxy resin and an epoxy resin obtained by an oxidation reaction of a compound having an olefin.

In addition, from the viewpoints of high chemical resistance, plasma resistance, and transparency, and low moisture absorption of the cured product, specific examples of a preferable epoxy resin include bisphenol A novolac type epoxy resins such as Epikote 157 (manufactured by Mitsubishi Chemical Corporation, epoxy equivalent: 180 to 250 g/eq., softening point: 80 to 90° C.) and EPON SU-8 (trade name, manufactured by Resolution Performance Products, LLC., epoxy equivalent: 195 to 230 g/eq., softening point: 80 to 90° C.);

biphenyl-phenol novolac type epoxy resins such as NC-3000 (trade name, manufactured by Nippon Kayaku Co., Ltd., epoxy equivalent: 270 to 300 g/eq., softening point: 55 to 75° C.):

bisphenol A type and F type epoxy resins in which some alcoholic hydroxyl groups are epoxidized, such as NER-7604 and NER-7403 (trade names, bisphenol F type epoxy resins in which some alcoholic hydroxyl groups are epoxidized, manufactured by Nippon Kayaku Co., Ltd., epoxy equivalent: 200 to 500 g/eq., softening point: 55 to 75° C.). NER-1302 and NER-7516 (trade names, bisphenol A type epoxy resins in which some alcoholic hydroxyl groups are epoxidized, manufactured by Nippon Kayaku Co., Ltd., epoxy equivalent: 200 to 500 g/eq., softening point: 55 to 75° C.);

cresol novolac type epoxy resins such as EOCN-1020 (trade name, manufactured by Nippon Kayaku Co., Ltd., epoxy equivalent: 190 to 210 g/eq., softening point: 55 to 85° C.):

polyfunctional epoxy resins such as NC-6300 (trade name, manufactured by Nippon Kayaku Co., Ltd., epoxy equivalent: 230 to 235 g/eq., softening point: 70 to 72° C.):

epoxy resins obtained by reacting a polybasic acid anhydride with a reaction product of an epoxy resin having at least two epoxy groups in one molecule and a compound having at least one hydroxyl group and one carboxyl group in one molecule, such as polycarboxylic acid epoxy resin (the epoxy equivalent is usually 300 to 900 g/eq.) whose production method is described in JP-A-10-97070;

trisphenolmethane type epoxy resins such as EPPN-201 (trade name, manufactured by Nippon Kayaku Co., Ltd., epoxy equivalent: 180 to 200 g/eq., softening point: 65 to 78° C.);

triphenylmethane type epoxy resins such as EPPN-501H (trade name, manufactured by Nippon Kayaku Co., Ltd., epoxy equivalent: 162 to 172 g/eq., softening point: 51 to 57° C.), EPPN-501HY (trade name, manufactured by Nippon Kayaku Co., Ltd., epoxy equivalent: 163 to 175 g/eq., softening point: 57 to 63° C.), and EPPN-502H (trade name, manufactured by Nippon Kayaku Co., Ltd., epoxy equivalent: 158 to 178 g/eq., softening point: 60 to 72° C.);

alicyclic epoxy resins such as EHPE3150 (trade name, manufactured by Daicel Corporation, epoxy equivalent: 170 to 190 g/eq., softening point; 70 to 85° C.):

dicyclopentadiene type epoxy resins such as XD-1000 (trade name, manufactured by Nippon Kayaku Co., Ltd., epoxy equivalent: 245 to 260 g/eq., softening point: 68 to 78° C.); and an epoxy resin that is a co-condensate obtained by a method described in JP-A-2007-291263 (the epoxy equivalent is usually 400 to 900 g/eq.).

The content of the epoxy resin in the photosensitive resin composition is preferably 85 mass % or more and preferably 99.9 mass % or less with respect to 100 mass % of the total amount of the photoacid generator and the epoxy resin from the viewpoint of improving the molding resistance of the hollow part 117.

The photosensitive resin composition may optionally contain a component other than the photoacid generator and epoxy resin, and as specific examples of such an optional component, may contain one or more of miscible and reactive epoxy monomers and solvents.

When the photosensitive resin composition contains a reactive epoxy monomer, the performance of a pattern can be improved. Specific examples of the reactive epoxy monomer include diethylene glycol diglycidyl ether, hexanediol diglycidyl ether, dimethylolpropane diglycidyl ether, polypropylene glycol diglycidyl ether (e.g., ED506 manufactured by ADEKA Corporation), trimethylolpropane triglycidyl ether (e.g., ED505 manufactured by ADEKA Corporation), trimethylolpropane triglycidyl ether (e.g., a low chlorine type, EX321L manufactured by Nagase ChemteX Corporation), and pentaerythritol tetraglycidyl ether. Among the above examples, a low chlorine type monomer obtained by a low chlorine production method or a purification process is preferred.

The content of the reactive epoxy monomer is, for example, more than 0 mass % in the solid content of the resist that is the total amount of the photoacid generator, the epoxy resin, and an optional reactive epoxy monomer, and from the viewpoint of suppressing mask sticking, is also preferably 10 mass % or less, and more preferably 7 mass % or less in the solid content.

The reactive epoxy monomer in this specification means an epoxy compound that is liquid at room temperature and has a weight average molecular weight of 1,000 or less, which is calculated in terms of polystyrene based on the measurement result of gel permeation chromatography (GPC).

When the photosensitive resin composition contains a solvent, the viscosity of the photosensitive resin composition is reduced, and the film coating properties can be improved. The solvent can be used without limitation as long as it is an organic solvent usually used for inks, paints, and the like and can dissolve each component of the photosensitive resin composition. Specific examples of the solvent include ketones such as acetone, ethyl methyl ketone, cyclohexanone, and cyclopentanone: aromatic hydrocarbons such as toluene, xylene, and tetramethylbenzene; glycol ethers such as dipropylene glycol dimethyl ether and dipropylene glycol diethyl ether; esters such as ethyl acetate, butyl acetate, butyl cellosolve acetate, carbitol acetate, propylene glycol monomethyl ether acetate, and γ-butyrolactone; alcohols such as methanol, ethanol, cellosolve, and methyl cellosolve: aliphatic hydrocarbons such as octane and decane; and petroleum-based solvents such as petroleum ether, petroleum naphtha, hydrogenated petroleum naphtha, and solvent naphtha.

The content of the solvent is preferably 10 mass % or more, and is also preferably 95 mass % or less, and more preferably 90 mass % or less with respect to the whole photosensitive resin composition from the viewpoint of appropriately maintaining the solubility of the main component, the volatility of the components, the liquid viscosity of the composition, and the like.

The photosensitive resin composition may further contain an adhesion imparting agent from the viewpoint of improving the adhesion of the composition to the substrate. The adhesion imparting agent is, for example, a coupling agent such as a silane coupling agent and titanium coupling agent, and is preferably a silane coupling agent.

The content of the adhesion imparting agent is, for example, more than 0 mass %, and is also preferably 15 mass % or less, and more preferably 5 mass % or less with respect to the whole photosensitive resin composition from the viewpoint of suppressing deterioration in physical properties of the cured film.

The photosensitive resin composition may further contain a sensitizer from the viewpoint of absorbing ultraviolet light and providing the absorbed light energy to the photoacid generator.

Specific examples of the sensitizer include thioxanthones such as 2,4-diethylthioxanthone, and anthracene compounds (9,10-dialkoxyanthracene derivatives) having C1 to C4 alkoxy groups at positions 9 and 10, such as 9,10-dimethoxy-2-ethylanthracene. The 9,10-dialkoxyanthracene derivatives may further have a substituent.

The sensitizer is more preferably 2,4-diethylthioxanthone and 9,10-dimethoxy-2-ethylanthracene.

Because the sensitizer exerts the effect even in a small amount, the content thereof is, for example, more than 0 mass %, and is also preferably 30 mass % or less, and more preferably 20 mass % or less with respect to the photoacid generator.

When it is necessary to reduce the influence of ions derived from the photoacid generator, the photosensitive resin composition may further contain an ion scavenger such as an organoaluminum compound.

The blending amount of the ion scavenger is, for example, more than 0 mass %, and is also preferably 10 mass % or less with respect to the solid content of the resist that is the total amount of the photoacid generator, the epoxy resin, and an optional reactive epoxy monomer.

The photosensitive resin composition may contain various additives such as a thermoplastic resin, a colorant, a thickener, an antifoaming agent, and a leveling agent.

Examples of the thermoplastic resin include polyethersulfone, polystyrene, and polycarbonate.

Examples of the colorant include phthalocyanine blue, phthalocyanine green, iodine green, crystal violet, titanium oxide, carbon black, and naphthalene black.

Examples of the thickener include orben, benton, and montmorillonite.

Examples of the antifoaming agent include silicone-based, fluorine-based, and polymer-based antifoaming agents.

The blending amount of each of the above additives can be appropriately controlled according to the purpose of use, and is, for example, 0.1 mass % or more, and is also, for example, 30 mass % or less with respect to the whole photosensitive resin composition.

The photosensitive resin composition may further contain an inorganic filler. Specific examples of the inorganic filler include barium sulfate, barium titanate, silicon oxide, amorphous silica, talc, clay, magnesium carbonate, calcium carbonate, aluminum oxide, aluminum hydroxide, and mica powder.

The blending proportion of the inorganic filler is, for example, more than 0 mass %, and is also, for example, 60 mass % or less in the photosensitive resin composition.

From the viewpoint of improving the molding resistance of the hollow part 117, the photosensitive resin composition preferably contains 0.1 parts by mass or more and 15 parts by mass or less of the photoacid generator, 85 parts by mass or more and 99.9 parts by mass or less of the epoxy resin, 1 part by mass or more and 10 parts by mass or less of the reactive epoxy monomer, and 5.8 parts by mass or more and 2090 parts by mass or less of the solvent, and the above-described adhesion imparting agent, sensitizer, ion scavenger, thermoplastic resin, colorant, thickener, antifoaming agent, leveling agent, and inorganic filler may be added as necessary.

Next, a method for producing the photosensitive resin composition will be described.

In an embodiment according to the present embodiment, the photosensitive resin composition can be obtained by, for example, mixing and stirring raw material components in predetermined blending amounts by an ordinary method, and may be dispersed and mixed using a disperser such as a dissolver, a homogenizer, or a three-roll mill, as necessary. In addition, after mixing, filtration may be further performed using a mesh, a membrane filter, or the like.

Next, the form of the photosensitive resin composition will be described. The photosensitive resin composition can be, for example, in a liquid form.

The photosensitive resin composition is preferably a dry film resist. The dry film resist is obtained by applying a photosensitive resin composition onto a base film using a roll coater, a die coater, a knife coater, a bar coater, a gravure coater, or the like, and then drying the photosensitive resin composition in a drying furnace set at, for example, 45° C. or higher and 100° C. or lower to remove a predetermined amount of solvent. A cover film or the like may be appropriately laminated on the resist. Specific examples of the base film and the cover film as the base material for the resist include films of polyester, polypropylene, polyethylene, triacetylcellulose (TAC), polyimide, and the like. These films may have been subjected to a release treatment with a silicone-based release treatment agent, a non-silicone-based release treatment agent, or the like.

Next, referring back to FIG. 1, the package 105 will be described. In the package 105, a semiconductor element 121 is flip-chip connected to the element mounted surface of the substrate 101 by bumps 123. In the package 105, the semiconductor element 121 and the bumps 123 are sealed with the sealing material 107.

Specific examples of the package 105 include Quad Flat Package (QFP), Small Outline Package (SOP), Ball Grid Array (BGA), Chip Size Package (CSP), Quad Flat Non-leaded Package (QFN), Small Outline Non-leaded Package (SON), Lead Flame BGA (LF-BGA), System In Package (SiP), and Land Grid Allay (LGA).

Next, the sealing material 107 will be described. The sealing material 107 is a cured product of a sealing resin composition. In FIG. 1, the sealing material 107 is provided over the entire element mounted surface of the substrate 101 to seal the hollow package 103 and the package 105.

(Sealing Resin Composition)

In an embodiment according to the present invention, the sealing resin composition is used for sealing the substrate 109, the partition wall 113, and the top plate 115 of the hollow package 103, and contains the following components (A) and (B).

(A) an epoxy resin containing one or more selected from the group consisting of an epoxy resin containing two epoxy groups in the molecule and an epoxy resin containing three or more epoxy groups in the molecule, and (B) an inorganic filler (Component (A))

The epoxy resin of component (A) contains one or more selected from the group consisting of an epoxy resin containing two epoxy groups in the molecule and an epoxy resin containing three or more epoxy groups in the molecule.

From the viewpoints of improving the filling properties of the sealing resin composition and improving the molding resistance of the hollow package, component (A) preferably contains one or more selected from the group consisting of biphenyl aralkyl type epoxy resins: triphenylmethane type epoxy resins; biphenyl type epoxy resins; and bisphenol type epoxy resins such as a bisphenol A type epoxy resin, bisphenol F type epoxy resin, and tetramethyl bisphenol F type epoxy resin, and more preferably contains one or more selected from the group consisting of a biphenyl aralkyl type epoxy resin, bisphenol A type epoxy resin, and bisphenol A type epoxy resin.

The content of component (A) in the sealing resin composition is preferably 2 mass % or more, more preferably 3 mass % or more, and still more preferably 4 mass % or more when the total amount of the sealing resin composition is 100 mass %, from the viewpoint of obtaining suitable fluidity for molding to improve the filling properties and moldability.

From the viewpoint of improving the molding resistance of the hollow package 103, the content of component (A) in the sealing resin composition is preferably 40 mass % or less, more preferably 30 mass % or less, still more preferably 15 mass % or less, and furthermore preferably 10 mass % or less when the total amount of the sealing resin composition is 100 mass %.

(Component (B))

As the inorganic filler of component (B), those generally used in sealing resin compositions can be used. Specific examples of the inorganic filler include silica such as fused silica and crystalline silica; alumina; talc; titanium oxide; silicon nitride; and aluminum nitride. These inorganic fillers may be used singly or in combination of two or more thereof.

Among these examples, from the viewpoint of excellent versatility, the inorganic filler preferably includes silica, and more preferably fused silica is used.

Regarding the size of the inorganic filler, from the viewpoint of enhancing the fluidity of the sealing resin composition to fill the space between the element 111 such as a semiconductor element and the substrate with the sealing resin composition without generation of a void and the like, the content of the undersize fraction of the inorganic filler passed through a sieve with a mesh size of 20 μm is preferably 80 mass % or more, more preferably 90 mass % or more, and still more preferably 100 mass % with respect to all the inorganic filler. In addition, the upper limit of the content of the undersize fraction of the organic filler passed through a sieve with a mesh size of 20 μm is not limited and is 100 mass % or less.

The content of the inorganic filler in the sealing resin composition is preferably 50 mass % or more, more preferably 70 mass % or more, and still more preferably 80 mass % or more when the total amount of the sealing resin composition is 100 mass %, from the viewpoint of improving the low moisture absorbency and low thermal expansion of the sealing material formed using the sealing resin composition to more effectively improve the moisture resistance reliability and reflow resistance of a semiconductor package to be obtained.

In addition, from the viewpoint of more effectively improving fluidity and filling properties for molding of the sealing resin composition, the content of all the inorganic filler in the sealing resin composition is preferably 95 mass % or less, more preferably 93 mass % or less, and still more preferably 90 mass % or less when the total amount of the sealing resin composition is 100 mass %.

In an embodiment according to the present invention, the sealing resin composition may contain a component other than the epoxy resin and the inorganic filler.

For example, the sealing resin composition may further contain a curing agent.

(Curing Agent)

The curing agent can be roughly classified into, for example, three types of a polyaddition type curing agent, a catalyst type curing agent, and a condensation type curing agent, and one or more thereof can be used.

Examples of the polyaddition type curing agent include polyamine compounds including aliphatic polyamines such as diethylenetriamine (DETA), triethylenetetramine (TETA), and meta-xylylenediamine (MXDA), aromatic polyamines such as diaminodiphenylmethane (DDM), m-phenylenediamine (MPDA), and diaminodiphenylsulfone (DDS), dicyandiamide (DICY), and an organic acid dihydrazide; acid anhydrides including alicyclic acid anhydrides such as hexahydrophthalic anhydride (HHPA) and methyltetrahydrophthalic anhydride (MTHPA), aromatic acid anhydrides such as trimellitic anhydride (TMA), pyromellitic anhydride (PMDA), and benzophenone tetracarboxylic acid (BTDA): phenolic resin curing agents such as a novolac type phenolic resin and polyvinyl phenol; polymercaptan compounds such as polysulfide, thioester, and thioether; isocyanate compounds such as an isocyanate prepolymer, blocked isocyanate; and organic acids such as a carboxylic acid-containing polyester resin.

Examples of the catalyst type curing agent include tertiary amine compounds such as benzyldimethylamine (BDMA) and 2,4,6-trisdimethylaminomethylphenol (DMP-30); imidazole compounds such as 2-methylimidazole and 2-ethyl-4-methylimidazole (EMI24); and Lewis acids such as a $BF_3$ complex.

Examples of the condensation type curing agent include phenol resins; urea resins such as a methylol group-containing urea resin; and melamine resins such as a methylol group-containing melamine resin.

Among these examples, a phenol resin curing agent is preferable from the viewpoint of improving the balance among flame resistance, moisture resistance, electrical properties, curability, storage stability, and the like. As the phenol resin curing agent, any of monomers, oligomers, and polymers having two or more phenolic hydroxyl groups in one molecule can be used, and the molecular weight and molecular structure thereof are not limited.

Examples of the phenol resin curing agent used for the curing agent include biphenyl aralkyl type phenol resins: novolac type phenol resins such as a phenol novolac resin, a cresol novolac resin, and a bisphenol novolac resin; polyvinylphenol; polyfunctional phenol resins such as a phenol-hydroxybenzaldehyde resin, a triphenylmethane type phenol resin, and modified triphenylmethane type phenol resins such as a triphenylmethane type phenol resin modified with formaldehyde; modified phenol resins such as a terpene-modified phenol resin and a dicyclopentadiene-modified phenol resin; aralkyl type phenol resins such as a phenol aralkyl resin having a phenylene backbone and/or a biphenylene backbone and a naphthol aralkyl resin having a phenylene backbone and/or a biphenylene backbone; and bisphenol compounds such as bisphenol A and bisphenol F. These phenol resin curing agents may be used singly or in combination of two or more thereof. Among these examples, from the viewpoint of improving the heat resistance and filling properties, it is preferable to use a polyfunctional phenol resin such as a phenol-hydroxy benzaldehyde resin. From the same viewpoint, it is also preferable to use one or more selected from the group consisting of a biphenyl aralkyl-based phenol resin and a triphenylmethane type phenol resin.

In an embodiment according to the present invention, the content of the curing agent in the sealing resin composition is preferably 1 mass % or more, more preferably 2 mass % or more, and still more preferably 3 mass % or more when the total amount of the sealing resin composition is 100 mass %, from the viewpoint of achieving excellent fluidity to improve the filling properties and moldability for molding.

In addition, for a semiconductor package including a cured product of the sealing resin composition as a sealing material, from the viewpoint of improving moisture resistance reliability and reflow resistance, the content of the curing agent in the sealing resin composition is preferably 25 mass % or less, more preferably 15 mass % or less, and still more preferably 10 mass % or less when the total amount of the sealing resin composition is 100 mass %.

Further, the sealing resin composition can contain a component other than the above-described components, and for example, one or more of various additives such as a coupling agent, a curing accelerator, a fluidity imparting agent, a mold release agent, an ion scavenger, a low-stress component, a flame retardant, a colorant, and an antioxidant can be appropriately blended. The content of each of these components can be, for example, about 0.1 to 5 mass % when the total amount of the sealing resin composition is 100 mass %.

Among these additives, the coupling agent can contain one or more selected from, for example, known coupling agents such as various silane compounds such as epoxysilane, mercaptosilane, and aminosilane such as secondary aminosilane, alkylsilane, ureidosilane, vinylsilane, and methacrylsilane; titanium compounds, aluminum chelates, and aluminum/zirconium compounds.

The curing accelerator (catalyst) can contain one or more selected from, for example, phosphorus atom-containing compounds such as an organic phosphine, a tetra-substituted phosphonium compound, a phosphobetaine compound, an adduct of a phosphine compound and a quinone compound, and an adduct of a phosphonium compound and a silane compound; nitrogen atom-containing compounds such as amidines and tertiary amines exemplified by 1,8-diazabicyclo[5.4.0]undecene-7, benzyldimethylamine, and 2-methylimidazole, and quaternary salts of the above amidines and amines. Among these examples, it is preferable to contain a phosphorus atom-containing compound from the viewpoint of improving curability. From the viewpoint of improving the balance between moldability and curability, it is also preferable to contain a compound having latency, such as a tetra-substituted phosphonium compound, a phosphobetaine compound, an adduct of a phosphine compound and a quinone compound, and an adduct of a phosphonium compound and a silane compound.

Specific examples of the fluidity imparting agent include 2,3-dihydroxynaphthalene.

The mold release agent can contain one or more selected from, for example, natural waxes such as a carnauba wax, synthetic waxes such as a montanic acid ester wax, higher fatty acids and metal salts thereof such as zinc stearate, and paraffins.

Specific examples of the ion scavenger include hydrotalcite.

Specific examples of the low-stress component include silicone oil and silicone rubber.

Specific examples of the flame retardant include aluminum hydroxide, magnesium hydroxide, zinc borate, zinc molybdate, and phosphazene.

Specific examples of the colorant include carbon black and red iron oxide.

Specific examples of the antioxidant include a hindered phenol compound, a hindered amine compound, and a thioether compound.

The glass transition temperature (Tg) of the cured product of the sealing resin composition is preferably 100° C. or higher, more preferably 110° C. or higher, and still more preferably 120° C. or higher from the viewpoint of improving the heat resistance of the cured product.

The upper limit of the Tg of the cured product is not limited, but is preferably 200° C. or lower, more preferably 180° C. or lower, and still more preferably 160° C. or lower from the viewpoint of improving the toughness of the cured product.

Here, the glass transition temperature of the cured product is measured under the conditions of a measurement temperature range of 0° C. to 320° C. and a temperature raising rate of 5° C./min using a thermal mechanical analysis (TMA) apparatus (manufactured by Seiko Instruments Inc., TMA100).

In an embodiment according to the present invention, the form of the sealing resin composition is preferably a tablet or particle form. Specific examples of the sealing resin composition having the particle form include a powdery or granular resin composition. Here, the case where the sealing resin composition is powdery or granular refers to a case where the sealing resin composition is in a powder form or a granular form.

Next, a method for manufacturing the sealing resin composition will be described.

In an embodiment according to the present invention, the sealing resin composition can be obtained by, for example, a method in which the above-described components are mixed by a known means, further melt-kneaded with a kneader such as a roll, a kneader, or an extruder, cooled, and then pulverized. In addition, the dispersion degree, fluidity, and the like of the sealing resin composition obtained may be appropriately controlled.

In an embodiment according to the present invention, by using each of the photosensitive resin composition and the sealing resin composition that contain the above-described components in predetermined amounts and setting the sizes of the partition wall 113 and the top plate 115 to predetermined dimensions, it is possible to stably maintain the hollow part 117 in the hollow package 103 and to obtain the structure 100 having excellent filling properties to narrow gaps between the plurality of bumps 123 and the like.

Although FIG. 1 illustrates an example in which the hollow package 103 and the package 105 are mounted on the substrate 101, in an embodiment according to the present invention, only the hollow package may be mounted, or the hollow package and an element having no hollow part may be mixedly mounted in a structure. Further, when a structure includes a plurality of packages, the plurality of packages may be individualized in a later process.

Next, a method for manufacturing the hollow package 103 and the structure 100 including the hollow package 103 will be described. In an embodiment according to the present invention, the method for manufacturing the hollow package 103 includes the following steps 1 and 2:

(step 1) providing one or more closed hollow parts 117 by forming the partition wall 113 and the top plate 115 including at least one organic material on the substrate 109, and (step 2) compression-molding the sealing resin composition of an embodiment according to the present invention as described above at a low pressure of 0.1 MPa or higher and lower than 5.0 MPa to resin-seal the substrate 109, the partition wall 113, and the top plate 115.

Hereinafter, a more specific description will be made with reference to FIGS. 2(a) to 2(d). FIGS. 2(a) to 2(d) are sectional views illustrating a manufacturing process for the structure 100.

Figure 2:
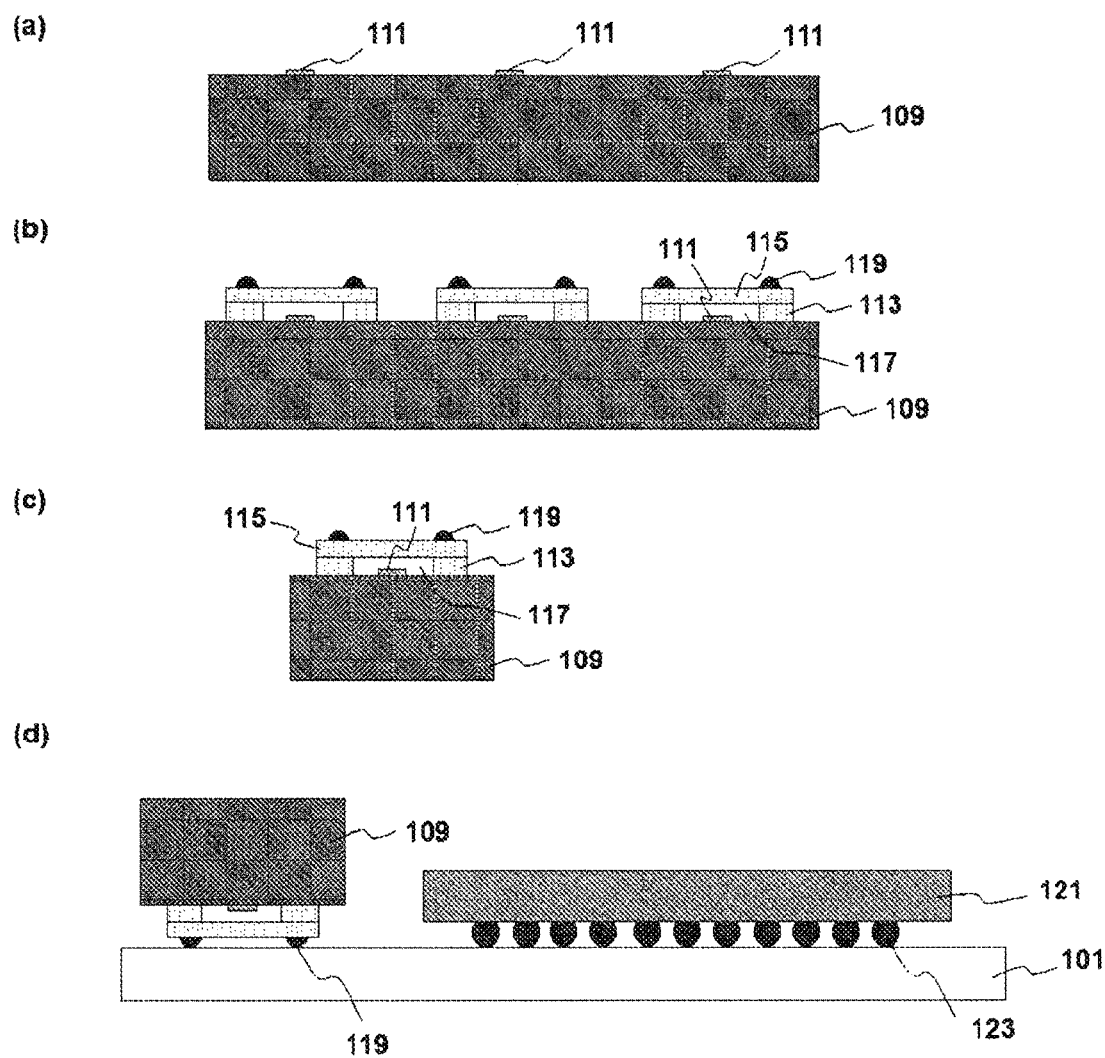
FIG. 2 is a sectional view illustrating a manufacturing process for a structure in an embodiment according to the present invention.

First, as illustrated in FIG. 2 (a), the element 111 is mounted on the substrate 109.

Next, as illustrated in FIG. 2 (b), the partition wall 113 that surrounds the outer periphery of the element 111 is formed on the element mounted surface of the substrate 109 so as to be separated from the element 111, the top plate 115 that covers the upper part of the partition wall 113 is formed on the partition wall 113, and the hollow part 117 is provided. However, as will be described later with reference to FIGS. 3 (a) to 3 (e), in some cases, the element 11 may be mounted after the partition wall is formed, and the top plate 115 may be finally formed.

The formation of the partition wall 113 and the top plate 115 that have a predetermined planar shape can be performed using, for example, the method described in WO-A-2012/008472 using the photosensitive resin composition described above.

Specifically, when a liquid photosensitive resin composition is used, the photosensitive resin composition is applied onto the substrate 109 provided with the element 11 in a thickness of, for example, 0.1 µm or more and 1000 µm or less using, for example, a spin coater or the like, and heat-treated at, for example, 60° C. or higher and 130° C. or lower for 5 minutes or more and 60 minutes or less to remove a solvent, thereby forming a photosensitive resin composition layer. Then, a mask having a pattern corresponding to the planar shape of the partition wall 113 is placed, irradiated with ultraviolet light, and heat-treated at, for example, 50° C. or higher and 130° C. or lower for 1 minute or more and 50 minutes or less. Thereafter, the unexposed portion is developed using a developer, for example, at 15° C. or higher and 50° C. or lower for 1 minute or more and 180 minutes or less to form a pattern.

The pattern is heat-treated at a temperature of, for example, 130° C. or higher and 200° C. or lower to obtain a permanent protective film. As the developer, for example, an organic solvent such as γ-butyrolactone, triethylene glycol dimethyl ether, or propylene glycol monomethyl ether acetate, or a mixed solution of these organic solvents and water can be used. For the development, a developing device such as a paddle type device, a spray type device, or a shower type device may be used, and ultrasonic waves may be appropriately irradiated.

When a dry film resist is used, for example, the cover film is removed, and the dry film resist is transferred to the substrate 109 at, for example, a temperature of 30° C. or higher and 100° C. or lower and a pressure of 0.05 MPa or higher and 2 MPa or lower with a hand roll, a laminator, or the like, and exposure, post-exposure baking, development, and heat treatment may be performed in a similar manner to the case of the liquid photosensitive resin composition.

The top plate 115 can be formed according to the method in the case of using the above-described dry film resist after the formation of the partition wall 113.

By using the film photosensitive resin composition (dry film resist), the steps of applying to the substrate 109 and drying can be omitted, so that the steps of manufacturing the partition wall 113 and the top plate 115 can be simplified.

After the formation of the top plate 115, bumps 119 such as solder bumps are formed at predetermined positions on the upper surface of the top plate 115, that is, the back side to the surface jointed with the partition wall 113 (FIG. 2 (b)).

FIGS. 2 (a) and 2 (b) illustrate an example in which a plurality of elements 111 is mounted on the substrate 109. In this case, as illustrated in FIG. 2 (c), the substrate 109 is individualized for each of the elements 111 to obtain a plurality of packages.

Next, the individualized package is flip-chip connected to a predetermined position on the substrate 101 by the bumps 119. In the manufacture of the structure 100, the semiconductor element 121 is also flip-chip connected to a predetermined position on the substrate 101 by the bumps 123 (FIG. 2 (d)).

Thereafter, the element mounted surface of the substrate 101 is sealed with the sealing resin composition of an embodiment according to the present invention to form the sealing material 107. For this formation, from the viewpoints of improving the molding resistance of the hollow package 103 and improving the filling properties to narrow gaps between the bumps 123 and the like, the sealing material 107 is preferably formed by compression molding.

From the same viewpoints, the molding pressure in the compression molding is preferably 0.1 MPa or higher, more preferably 0.5 MPa or higher, and is also preferably lower than 5.0 MPa, more preferably 3.0 MPa or lower, still more preferably 2.0 MPa or lower, and furthermore preferably 1.0 MPa or lower.

Through the above steps, the structure 100 including the hollow package 103 and the package 105 can be obtained. In an embodiment according to the present invention, by performing low pressure molding by the compression molding method using the sealing resin composition containing components (A) and (B), the molding resistance of the hollow part 117 provided in the hollow package 103 can be improved, and the filling properties to the gaps between the bumps 123 can be improved even when the bumps 123 are disposed at a narrow pitch in the package 105.

In the above description, the partition wall 113 and the top plate 115 are formed after the element 111 is mounted on the substrate 109, but the formation order for the members may be other than this order. For example, FIGS. 3 (a) to 3 (e) are sectional views illustrating another manufacturing process of the structure 110.

Figure 3:
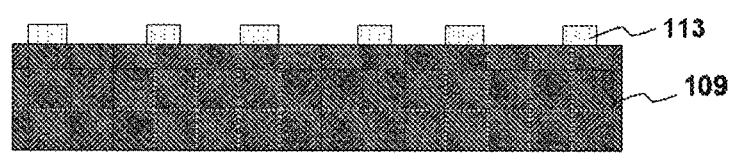
FIG. 3 is a sectional view illustrating a manufacturing process for a structure in an embodiment according to the present invention.
Figure 3:
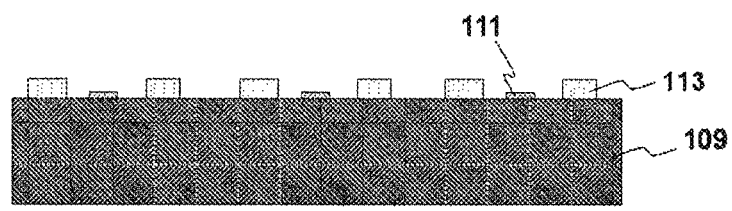
Figure 3:
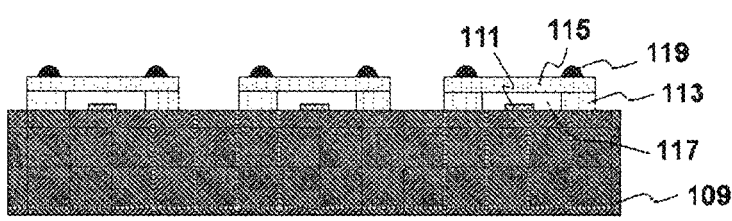
Figure 3:
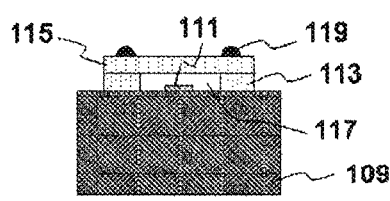
Figure 3:
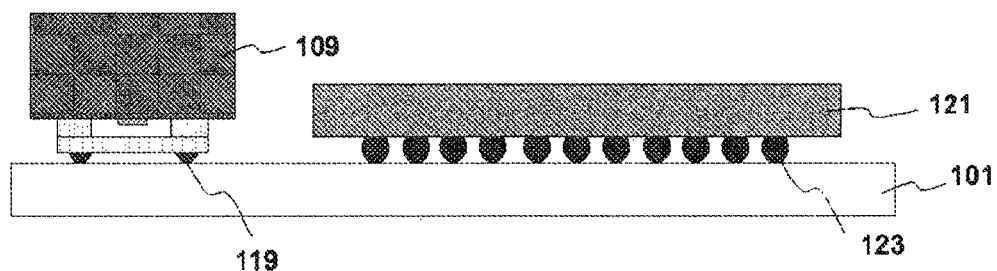

In the manufacturing process illustrated in FIGS. 3 (a) to 3 (e), first, the partition walls 113 are each formed at a predetermined position on the substrate 109 (FIG. 3 (a)). Thereafter, the elements 111 are mounted on the substrate 109 so that each of the outer periphery thereof is surrounded by the partition wall 113 (FIG. 3 (b)).

Next, the top plates 115 that each cover the upper part of the partition wall 113 are formed on the partition walls 113, and the hollow parts 117 are provided (FIG. 3 (c)). These steps can be performed, for example, in a similar manner to the steps described above with reference to FIGS. 2 (a) and 2 (b).

Thereafter, the bumps 119 such as solder bumps are formed in a similar manner to the respective steps with reference to FIGS. 2 (b) and 2 (c) (FIG. 3 (c)), and the substrate 109 is individualized for each of the elements 111 to obtain a plurality of packages (FIG. 3 (d)). Then, in a similar manner to the step with reference to FIG. 2 (d), the individualized package is flip-chip connected to a predetermined position on the substrate 101 (FIG. 3 (e)).

Through the above steps, the structure 100 including the hollow package 103 and the package 105 is also obtained, and the same effect as the above-described effect can be obtained.

Although the present invention has been described above based on the embodiments, the present invention is not limited to these embodiments, and each of the elements can be changed without changing the gist of the present invention.

EXAMPLES

Hereinafter, the embodiments according to the present invention will be illustrated in detail with reference to Example. It should be noted that the embodiments are not limited to the description of the example at all.

Example 1

A sealing resin composition was prepared with the formulation shown in Table 1, and the filling properties and the molding resistance of a hollow part when an element was sealed with the cured product of the obtained composition were evaluated.

First, raw material components of the sealing resin composition used in the following example are shown.
(Epoxy Resin)
  Epoxy resin 1: a mixed resin of a biphenylene backbone-containing phenol aralkyl type epoxy resin (manufactured by Nippon Kayaku Co., Ltd., NC3000L) and a bisphenol A type epoxy resin (manufactured by Japan Epoxy Resins Co., Ltd., jER (registered trademark) YL6810)
  Epoxy resin 2: a biphenylene backbone-containing phenol aralkyl type epoxy resin (manufactured by Nippon Kayaku Co., Ltd., NC3000L)
(Curing Agent)
  Curing agent 1: a biphenylene backbone-containing phenol aralkyl type resin (manufactured by Meiwa Plastic Industries, Ltd., MEH-7851SS)
(Catalyst)
  Catalyst 1: tetraphenylphosphonium bis (naphthalene-2, 3-dioxy)phenyl silicate and tetraphenylphosphonium-4,4'-sulfonyldiphenolate.
(Inorganic Filler)
  Inorganic filler 1: a fused spherical silica (manufactured by Micron, Inc., TS-6021), the fraction passed through a sieve with a mesh size of 20 μm: 100 mass %
(Preparation of Sealing Resin Composition)

Based on the formulation shown in Table 1, raw materials were kneaded at 110° C. for 7 minutes using a twin-screw kneading extruder. The kneaded product obtained was degassed and cooled, and then pulverized by a pulverizer to obtain a granular sealing resin composition.
(Physical Properties of Sealing Resin Composition)
(Tg)

Using a compression molding machine (manufactured by TOWA Corporation, PMC1040), the sealing resin composition obtained was compression molded in a mold under the conditions of a mold temperature of 175° C., a molding pressure of 9.8 MPa, and a curing time of 300 seconds to obtain a cured product. This cured product had a length of 10 mm, a width of 4 mm, and a thickness of 4 mm.

Subsequently, the cured product obtained was post-cured at 175° C. for 4 hours, and then the Tg was calculated by performing measurement using a thermomechanical analyzer (manufactured by Seiko Instruments & Electronics Ltd., TMA100) under the conditions of a measurement temperature range of 0° C. to 320° C. and a temperature raising rate of 5° C./min.
(Evaluation)
(Filling Properties)

A semiconductor element having a thickness of 100 μm and a size of 5 mm×5 mm was flip-chip connected onto a substrate (printed wiring board including a copper circuit) by bumps. The material of the bump was Cu, the bump height was 50 μm, the bump diameter was 90 μm, and the pitch between the bumps was 90 μm. Six of the above semiconductor elements were bonded onto one substrate and fixed to the upper mold by a substrate fixing means so that the surface on which the semiconductor elements were mounted was directed downward. Subsequently, the resin granules composed of the sealing resin composition were supplied into the lower mold cavity, and then subjected to panel molding with a compression molding machine (manufactured by TOWA Corporation) while the inside of the cavity was decompressed, thus obtaining a molded article. The molding conditions for this molding were a mold temperature of 150° C. or 175° C., a molding pressure of 1.0 MPa or 2.0 MPa, and a curing time of 300 seconds.

The molded article obtained was not individualized, and the filling properties were evaluated as it was using a microscope manufactured by KEYENCE CORPORATION. For the six semiconductor elements, the presence or absence of filling defects such as an unfilled portion and void in the region between the bumps was confirmed, and the number of elements in which a filling defect occurred in the six elements was defined as a filling defect occurrence rate (%).

TABLE 1

|  |  |  | Example 1 |
| --- | --- | --- | --- |
| Raw materials (mass %) | Epoxy resin 1 |  | 4 |
|  | Epoxy resin 2 |  | 4 |
|  | Curing agent 1 |  | 5 |
|  | Catalyst 1 |  | 1 |
|  | Inorganic filler 1 |  | 86 |
|  | Total |  | 100 |
| Tg of cured product of sealing resin component (° C.) |  |  | 130 |
| Evaluation results | Filling defect occurrence rate (%) | 150° C., 1 MPa | 0 |
|  |  | 150° C., 2 MPa | 0 |
|  |  | 175° C., 1 MPa | 0 |
|  |  | 175° C., 2 MPa | 0 |

From Table 1, the sealing resin composition obtained in Example 1 was excellent in filling properties to narrow gaps.

(Molding Resistance of Hollow Part)

The molding resistance of hollow parts when a structure provided with the hollow parts was sealed with the sealing resin composition of Example 1 was evaluated.

As negative photosensitive dry film resists, SU-8 3000CF DFR series (trade name, manufactured by Nippon Kayaku Co., Ltd., dry film resists each having a thickness of 20 μm (3020CF), 30 μm (3030CF), or 45 μm (3045CF) and containing an epoxy resin, a photoacid generator, and the like) were used.

A structure provided with hollow parts was formed by the following procedure. That is, a negative photosensitive dry film resist from which the cover film was peeled off was laminated on a silicon wafer a predetermined number of times at a roll temperature of 70° C., an air pressure of 0.2 MPa, and a speed of 0.5 m/min to obtain a photosensitive resin composition layer having a predetermined thickness. The photosensitive resin composition layer was subjected to pattern exposure (soft contact, i-line) using an i-line exposure apparatus (mask aligner: manufactured by USHIO Inc.). Thereafter, post-exposure baking was performed at 95° C. for 4 minutes on a hot plate, and development processing was performed at 23° C. for 5 minutes by an immersion method using propylene glycol monomethyl ether acetate (PGMEA), thereby obtaining a cured resin pattern on the wafer. Thereafter, hard baking was performed at 180° C. for 60 minutes using a hot air convection oven. The obtained resin pattern had a configuration in which linear resins having a predetermined height and width were disposed in parallel at a predetermined interval and was used as partition walls.

Next, on the wafer on which the partition walls were formed, a photosensitive dry film resist from which the cover film was peeled off was laminated a predetermined number of times at a roll temperature of 40° C., an air pressure of 0.1 MPa, and a speed of 1.0 m/min to obtain a photosensitive resin composition layer having a predetermined thickness. Then, pattern exposure, post-exposure baking, development processing, and hard baking were performed according to the method for forming the partition walls, and a resin pattern covering the upper part between adjacent partition walls was formed with a predetermined width and thickness, and was used as top plates.

The sizes of the partition wall and top plate are shown below.

Partition wall thickness (height of an opening): 20 μm
Interval between partition walls (width of an opening): 10 to 500 μm (prepared every 10 μm)
Partition wall width: 30 μm
Top plate thickness: 20 μm, 30 μm, or 45 μm
Top plate width: a size such that the interval between partition walls described above is added to the sum of the widths of the partition walls on both side of the opening (60 μm), 70 to 560 μm The wafer on which the structure including the top plates and partition walls were formed was placed in a compression molding machine (manufactured by TOWA Corporation), and compression molding was performed using the sealing resin composition of Example 1 to obtain samples. The compression molding conditions were a mold temperature of 175° C., a molding pressure of 1.0 MPa, 2.0 MPa, or 3.0 MPa, and a curing time of 120 seconds.

Figure 4:
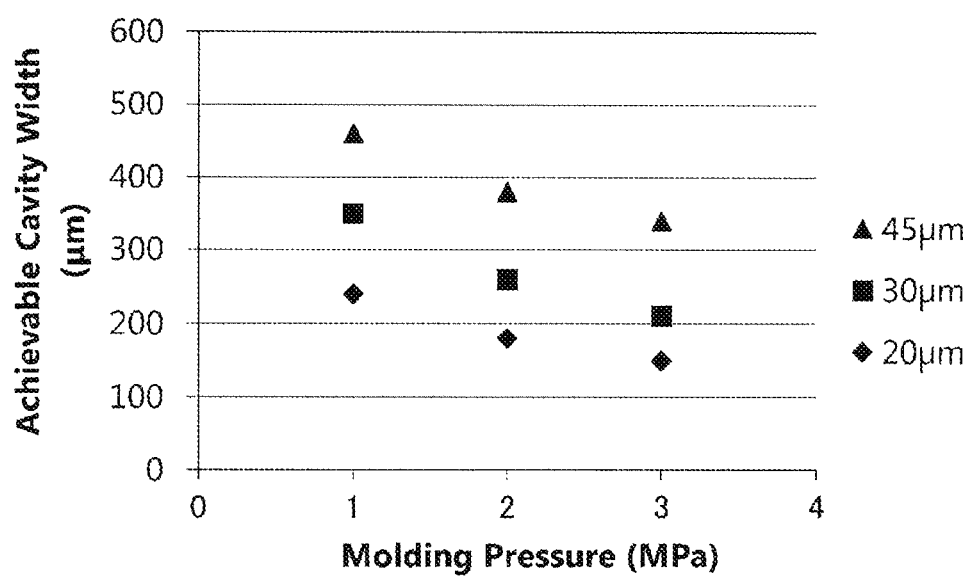
FIG. 4 is a graph showing an evaluation result of the molding resistance of a structure provided with hollow parts.

For the samples obtained in Example 1, the molding resistance of the hollow parts was evaluated. That is, for each sample, the cross section of the hollow part was observed with a scanning electron microscope, the maximum cap displacement (δmax) of the top plate was measured based on the following, and a sample having δmax of less than 5 μm was regarded as acceptable.

δmax=Height of surface of top plate on partition wall−Height of surface of top plate at midpoint of interval between partition walls FIG. 4 is a graph showing the relationship between the molding pressure (MPa) for each top plate thickness and the maximum value of the top plate width (μm) of a sample that obtained an acceptable result for δmax.

This application claims priority based on Japanese Patent Application No. 2018-246180 filed on Dec. 27, 2018, the disclosure of which is incorporated by reference herein in its entirety.

The invention claimed is:

1. A method for manufacturing a hollow package, the method comprising the following steps 1 and 2:
   (step 1) providing one or more closed hollow parts by forming a partition wall and a top plate that are comprised of at least one organic material on a substrate; and
   (step 2) compression-molding a sealing resin composition at a low pressure of 0.1 MPa or more and less than 5.0 MPa to resin-seal the substrate, the partition wall, and the top plate,
   wherein the step 1 includes a step of mounting one or more elements selected from the group consisting of a semiconductor element, a MEMS component, and an electronic component on the substrate so that the one or more elements are disposed in the one or more closed hollow parts, and
   the sealing resin composition contains:
   (A) an epoxy resin containing one or more epoxy resins selected from the group consisting of an epoxy resin containing two epoxy groups in a molecule and an epoxy resin containing three or more epoxy groups in a molecule; and
   (B) an inorganic filler.

2. The method for manufacturing a hollow package according to claim 1, wherein the organic material is a photosensitive dry film resist.

3. The method for manufacturing a hollow package according to claim 2, wherein the organic material is a negative photosensitive dry film resist.

4. The method for manufacturing a hollow package according to claim 3, wherein the organic material is the negative photosensitive dry film resist containing a photoacid generator and an epoxy resin.

5. The method for manufacturing a hollow package according to claim 1, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

6. The method for manufacturing a hollow package according to claim 2, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

7. The method for manufacturing a hollow package according to claim 3, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

8. The method for manufacturing a hollow package according to claim 4, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

9. A method for manufacturing a hollow package, the method comprising: forming a partition wall and a top plate that are comprised of at least one organic material on a substrate, thereby providing an assembly of the substrate, the partition wall, and the top plate, the assembly having one or more closed hollow parts and compression-molding a sealing resin composition surrounding the assembly of the substrate, the partition wall, and the top plate at a low pressure of 0.1 MPa or more and less than 5.0 MPa to resin-seal the assembly of the substrate, the partition wall, and the top plate,
wherein one or more elements selected from the group consisting of a semiconductor element, a MEMS component, and an electronic component are mounted on the substrate so that the one or more elements are disposed in the one or more closed hollow parts, and
the sealing resin composition contains:
(A) an epoxy resin containing one or more epoxy resins selected from the group consisting of an epoxy resin containing two epoxy groups in a molecule and an epoxy resin containing three or more epoxy groups in a molecule; and
(B) an inorganic filler.

10. The method for manufacturing a hollow package according to claim 9, wherein the organic material is a photosensitive dry film resist.

11. The method for manufacturing a hollow package according to claim 10, wherein the organic material is a negative photosensitive dry film resist.

12. The method for manufacturing a hollow package according to claim 11, wherein the organic material is the negative photosensitive dry film resist containing a photoacid generator and an epoxy resin.

13. The method for manufacturing a hollow package according to claim 10, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

14. The method for manufacturing a hollow package according to claim 11, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

15. The method for manufacturing a hollow package according to claim 12, wherein the component (A) contains one or more epoxy resins selected from the group consisting of a biphenyl aralkyl type epoxy resin, a triphenylmethane type epoxy resin, a biphenyl type epoxy resin, and a bisphenol type epoxy resin.

* * * * *